United States Patent
Hsieh et al.

(10) Patent No.: US 6,468,863 B2
(45) Date of Patent: Oct. 22, 2002

(54) SPLIT GATE FIELD EFFECT TRANSISTOR (FET) DEVICE EMPLOYING DIELECTRIC BARRIER LAYER AND METHOD FOR FABRICATION THEREOF

(75) Inventors: Chia-Ta Hsieh, Tainan; Di-Son Kuo, Hsinchu; Jake Yeh; Chuan-Li Chang, both of Hsin-Chu; Wen-Ting Chu, Kaohsiung County; Sheng-Wei Tsaur, Hsin-Chu, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/761,276

(22) Filed: Jan. 16, 2001

(65) Prior Publication Data

US 2002/0093044 A1 Jul. 18, 2002

(51) Int. Cl.$^7$ ............................................. H01L 21/336
(52) U.S. Cl. ........................ 438/261; 438/257; 438/211
(58) Field of Search ................................ 438/201, 257, 438/217, 263, 264; 257/321, 261, 214

(56) References Cited

U.S. PATENT DOCUMENTS

| | | | | |
|---|---|---|---|---|
| 4,441,247 A | * | 4/1984 | Gargini et al. ................ 29/571 |
| 5,480,821 A | * | 1/1996 | Chang ........................... 437/43 |
| 6,005,809 A | * | 12/1999 | Sung et al. ............. 365/185.29 |
| 6,043,530 A | * | 3/2000 | Chang .......................... 257/320 |
| 6,046,086 A | * | 4/2000 | Lin et al. ..................... 438/264 |
| 6,057,197 A | * | 5/2000 | Sung ........................... 438/296 |
| 6,287,916 B1 | * | 9/2001 | Mehta ......................... 438/257 |
| 6,326,662 B1 | * | 12/2001 | Hsieh .......................... 257/316 |
| 6,372,672 B1 | * | 4/2002 | Kim et al. ................... 438/791 |

* cited by examiner

Primary Examiner—Tom Thomas
Assistant Examiner—Thomas Magee
(74) Attorney, Agent, or Firm—Tung & Associates

(57) ABSTRACT

Within both a method for fabricating a split gate field effect transistor and the split gate field effect transistor fabricated employing the method, there is employed a patterned silicon nitride barrier dielectric layer formed covering a first portion of a floating gate and a first portion of a semiconductor substrate adjacent the first portion of the floating gate. Within the first portion of the semiconductor substrate there is eventually formed a source/drain region, and more particularly a source region, when fabricating the split gate field effect transistor. The patterned silicon nitride barrier dielectric layer inhibits when fabricating the split gate field effect transistor ion implant damage of the floating gate and oxidative loss of a floating gate electrode edge.

9 Claims, 2 Drawing Sheets

SPLIT GATE FIELD EFFECT TRANSISTOR (FET) DEVICE EMPLOYING DIELECTRIC BARRIER LAYER AND METHOD FOR FABRICATION THEREOF

BACKGROUND OF THE INVENTION

1. Field of the Invention

The present invention relates generally to split gate field effect transistor (FET) devices, as employed within semiconductor integrated circuit microelectronic fabrications. More particularly, the present invention relates to split gate field effect transistor (FET) devices with enhanced properties, as employed within semiconductor integrated circuit microelectronic fabrications.

2. Description of the Related Art

In addition to conventional semiconductor integrated circuit microelectronic fabrications having formed therein conventional field effect transistor (FET) devices and conventional bipolar junction transistor (BJT) devices whose transient operation provides for data storage and transduction capabilities within the conventional semiconductor integrated circuit microelectronic fabrications, there also exists within the art of semiconductor integrated circuit microelectronic fabrication non-volatile semiconductor integrated circuit microelectronic fabrications, and in particular non-volatile semiconductor integrated circuit microelectronic memory fabrications, such as but not limited to electrically erasable programable read only memory (EEPROM) non-volatile semiconductor integrated circuit microelectronic memory fabrications, whose data storage and transduction capabilities are not predicated upon transient operation.

Although non-volatile semiconductor integrated circuit microelectronic memory fabrications, such as but not limited to electrical erasable programmable read only memory (EEPROM) non-volatile semiconductor integrated circuit microelectronic memory fabrications, may be fabricated while employing any of several semiconductor integrated circuit microelectronic devices, a particularly common semiconductor integrated circuit microelectronic device employed within an electrically erasable programmable read only memory (EEPROM) non-volatile semiconductor integrated circuit microelectronic memory fabrication is a split gate field effect transistor (FET) device.

A split gate field effect transistor (FET) device is in part analogous in structure and operation with a conventional field effect transistor (FET) device insofar as a split gate field effect transistor (FET) device also comprises formed within a semiconductor substrate a channel region defined by a pair of source/drain regions also formed within the semiconductor substrate, wherein at least the channel region of the semiconductor substrate has formed thereupon a gate dielectric layer which separates a gate electrode from the channel region of the semiconductor substrate, but a split gate field effect transistor (FET) device is nonetheless distinguished from a conventional field effect transistor (FET) device by employing rather than a single gate electrode positioned upon the gate dielectric layer and completely covering the channel region of the semiconductor substrate: (1) a floating gate electrode positioned upon the gate dielectric layer and covering over only a portion of the channel region defined by the pair of source/drain regions (such portion of the channel region also referred to as a floating gate electrode channel region); and (2) a control gate electrode positioned over the gate dielectric layer and covering a remainder portion of the channel region while at least partially covering and overlapping the floating gate electrode while being separated from the floating gate electrode by an inter-gate electrode dielectric layer (such remainder portion of the channel region also referred to as a control gate electrode channel region).

In order to effect operation of a split gate field effect transistor (FET) device, particular sets of voltages are applied to the control gate electrode, the source/drain regions and the semiconductor substrate in order to induce or reduce charge within the floating gate electrode (which is otherwise fully electrically isolated) and thus provide conditions under which the floating gate electrode within the split gate field effect transistor (FET) device may be programmed, erased and/or read.

While split gate field effect transistor (FET) devices are thus desirable within the art of semiconductor integrated circuit microelectronic fabrication for providing semiconductor integrated circuit microelectronic fabrications with non-volatile data storage characteristics, split gate field effect transistor (FET) devices are nonetheless not entirely without problems in the art of semiconductor integrated circuit microelectronic fabrication.

In that regard, it is often difficult to form within non-volatile semiconductor integrated circuit microelectronic fabrications split gate field effect transistor (FET) devices with enhanced properties, such as but not limited to enhanced data retention properties and enhanced programming speed properties.

It is thus towards the goal of providing for use within semiconductor integrated circuit microelectronic fabrications, and in particular within semiconductor integrated circuit microelectronic memory fabrications, split gate field effect transistor (FET) devices with enhanced properties, such as but not limited to enhanced data retention properties and enhanced programming speed properties, that the present invention is directed.

Various non-volatile semiconductor integrated circuit microelectronic fabrications, associated semiconductor integrated circuit microelectronic devices formed therein, methods for fabrication thereof and methods for operation thereof, have been disclosed within the art of non-volatile semiconductor integrated circuit microelectronic fabrication.

For example, Sung et al., in U.S. Pat. No. 6,005,809, discloses a method for programming within a semiconductor integrated circuit microelectronic fabrication a split gate field effect transistor (FET) device with enhanced programming speed and a method for erasing within the semiconductor integrated circuit microelectronic fabrication the split gate field effect transistor (FET) device with enhanced erasing speed, while simultaneously enhancing a cycling endurance of the split gate field effect transistor (FET) device. To realize the enhanced programming speed, the programming method employs applying within the split gate field effect transistor (FET) device a simultaneous first positive voltage to a control gate, a first moderately negative voltage to a semiconductor substrate and a first slightly positive voltage to a drain region in order to establish a constant programming current, and then applying a second positive voltage to a source region for programming purposes. Similarly, to realize the enhanced erasing speed, the erasing method employs applying within the split gate field effect transistor (FET) device a large positive voltage to the control gate, the first moderately negative voltage to the semiconductor substrate and a second moderately negative voltage to the source region.

In addition, Chang, in U.S. Pat. No. 6,043,530, discloses an electrically erasable programmable read only memory (EEPROM) device that may be both programmed and read while employing low currents for both programming operations and erasing operations. The electrically erasable programmable read only memory (EEPROM) device is fabricated with a structure generally analogous with a stacked gate field effect transistor (FET) device, but with a control gate of width less than a floating gate width and centered within the floating gate width, and further wherein there is employed adjacent both the floating gate and the control gate, but spaced further from the control gate than the floating gate, a polysilicon sidewall spacer employed as an erasing gate.

Finally, Lin et al., in U.S. Pat. No. 6,046,086, discloses a split gate field effect transistor (FET) device, and a method for fabricating the split field effect transistor (FET) device, wherein the split gate field effect transistor (FET) device has enhanced data retention properties and enhanced capacitive coupling properties. To realize the foregoing objects, the split gate field effect transistor (FET) device employs as a gate dielectric layer a laminate of a silicon oxide layer having a silicon nitride layer formed thereupon, rather than a silicon oxide layer alone.

Desirable within the art of non-volatile semiconductor integrated circuit microelectronic fabrication, and in particular in the art of non-volatile semiconductor integrated circuit microelectronic memory fabrication, are additional methods and materials which may be employed for forming split gate field effect transistor (FET) devices with enhanced properties, such as but not limited to enhanced data retention properties and enhanced programming speed properties.

It is towards the foregoing object that the present invention is directed.

SUMMARY OF THE INVENTION

A first object of the present invention is to provide for use within a semiconductor integrated circuit microelectronic fabrication a split gate field effect transistor (FET) device, and a method for fabricating the split gate field effect transistor (FET) device.

A second object of the present invention is to provide the split gate field effect transistor (FET) device and the method for fabricating the split gate field effect transistor (FET) device in accord with the first object of the present invention, wherein the split gate field effect transistor (FET) device is fabricated with enhanced properties.

A third object of the present invention is to provide the split gate field effect transistor (FET) device and the method for fabricating the split gate field effect transistor (FET) device in accord with the first object of the present invention and the second object of the present invention, wherein the method is readily commercially implemented.

In accord with the objects of the present invention, there is provided by the present invention a split gate field effect transistor (FET) device and a method for fabricating the split gate field effect transistor (FET) device. To practice the method of the present invention, there is first provided a semiconductor substrate. There is then formed upon the semiconductor substrate a gate dielectric layer. There is then formed upon the gate dielectric layer a floating gate. There is also formed covering the floating gate an inter-gate dielectric layer. There is also formed covering a first portion of the floating gate and a first portion of the semiconductor substrate adjacent the first portion of the floating gate a patterned silicon nitride barrier dielectric layer. There is also formed over the inter-gate dielectric layer and covering a second portion of the floating gate not covered by the patterned silicon nitride barrier dielectric layer and a second portion of the semiconductor substrate adjacent the second portion of the floating gate not covered by the patterned silicon nitride barrier dielectric layer a patterned control gate. Finally, there is then formed into the first portion of the semiconductor substrate and a third portion of the semiconductor substrate spaced from the first portion of the semiconductor substrate by the second portion of the semiconductor substrate a pair of source/drain regions.

The method of the present invention contemplates a split gate field effect transistor (FET) device which may be fabricated employing the method of the present invention.

The present invention provides: (1) a method for fabricating within a semiconductor integrated circuit microelectronic fabrication, and in particular within a non-volatile semiconductor integrated circuit microelectronic memory fabrication, a split gate field effect transistor (FET) device; and (2) the split gate field effect transistor (FET) fabricated employing the method, where the split gate field effect transistor (FET) device is fabricated with enhanced properties, such as but not limited to enhanced data retention properties and enhanced programming speed properties. The present invention realizes the foregoing objects by employing when fabricating a split gate field effect transistor (FET) device a patterned silicon nitride barrier dielectric layer formed covering a first portion of a floating gate and a first portion of a semiconductor substrate adjacent the first portion of the floating gate. Within the present invention, the patterned silicon nitride barrier dielectric layer inhibits: (1) oxidative loss of a floating gate edge which would otherwise provide for compromised programming speed properties within the split gate field effect transistor (FET) device; and (2) ion implant damage of the floating gate which would otherwise provide for compromised data retention properties within the split gate field effect transistor (FET) device.

The split gate field effect transistor (FET) device fabricated in accord with the present invention is readily commercially implemented. A split gate field effect transistor (FET) device fabricated in accord with the present invention employs methods and materials as are generally known in the art of semiconductor integrated circuit microelectronic fabrication, including but not limited to non-volatile semiconductor integrated circuit microelectronic memory fabrication, but employed within the context of a novel ordering and sequencing of process steps and materials fabrication to provide the split gate field effect transistor (FET) device in accord with the present invention. Since it is thus a novel ordering and sequencing of methods and materials fabrication which provides at least in part the present invention, rather than the existence of methods and materials which provides the present invention, the method of the present, invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides: (1) a method for fabricating within a semiconductor integrated circuit microelectronic fabrication, and in particular within a non-volatile semiconductor integrated circuit microelectronic memory fabrication, a split gate field effect transistor (FET) device; and (2) the split gate field effect transistor (FET) device fabricated employing the method, where the split gate field effect transistor (FET) device is fabricated with enhanced properties, such as but not limited to enhanced data retention properties and enhanced programming speed properties. The present invention realizes the foregoing objects by employing when fabricating a split gate field effect transistor in accord with the present invention a patterned silicon nitride barrier dielectric layer formed covering a first portion of a floating gate and a first portion of a semiconductor substrate adjacent the first portion of the floating gate. Within the present invention, the patterned silicon nitride barrier layer inhibits: (1) oxidative loss of a floating gate electrode edge which would otherwise provide for compromised programming speed properties within the split gate field effect transistor (FET) device; and (2) ion implant damage of the floating gate which would otherwise provide for compromised data retention properties within the split gate field effect transistor (FET) device.

The split gate field effect transistor (FET) device fabricated in accord with the present invention may be fabricated within a non-volatile semiconductor integrated circuit microelectronic fabrication such as but not limited to a non-volatile semiconductor integrated circuit microelectronic memory fabrication such as but not limited to an electrically erasable programmable read only memory (EEPROM) semiconductor integrated circuit microelectronic memory fabrication such as but not limited to a flash memory fabrication.

Referring now to FIG. 1 to FIG. 5, there is shown a series of schematic cross-sectional diagrams illustrating the results of progressive stages in forming within a semiconductor integrated circuit microelectronic fabrication in accord with a preferred embodiment of the present invention a pair of split gate field effect transistor (FET) devices.

Figure 1:
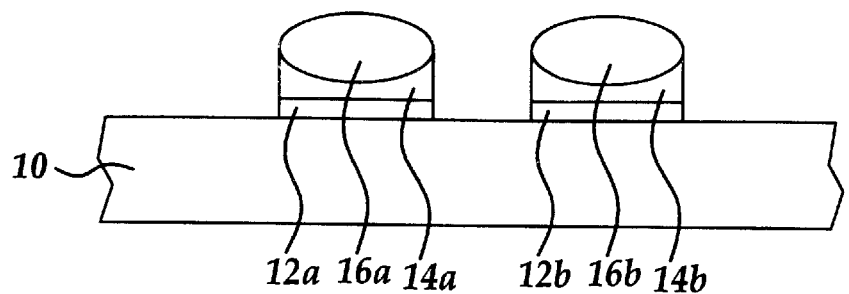
FIG. 1, FIG. 2, FIG. 3, FIG. 4 and FIG. 5 show a series of schematic cross-sectional diagrams illustrating the results of progressive stages of fabricating within a semiconductor integrated circuit microelectronic fabrication in accord with a preferred embodiment of the present invention a pair of split gate field effect transistor (FET) devices.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed thereupon a pair of patterned gate dielectric layers 12a and 12b, in turn having formed thereupon a of floating gate electrodes 14a and 14b, in turn having formed thereupon a pair of patterned silicon oxide hard mask layers 16a and 16b.

Within the preferred embodiment of the present invention with respect to the semiconductor substrate 10, although it is known in the art of semiconductor integrated circuit microelectronic fabrication that semiconductor substrates may be formed with either dopant polarity, several dopant concentrations and various crystallographic orientations, for the preferred embodiment of the present invention, the semiconductor substrate 10 is typically and preferably a (100) silicon semiconductor substrate having an N- or P-doping of sufficient concentration to impart the semiconductor substrate 10.

Similarly, within the preferred embodiment of the present invention with respect to the pair of patterned gate dielectric layers 12a and 12b, although it is also known in the art of semiconductor integrated circuit microelectronic fabrication that gate dielectric layers may be formed employing methods including but not limited to gate dielectric layer thermal growth methods and gate dielectric layer deposition/patterning methods, for the preferred embodiment of the present invention, the pair of patterned gate dielectric layers 12a and 12b is typically and preferably formed employing a gate dielectric layer thermal growth method at a temperature of from about 800 to about 1100 degrees centigrade to form the pair of patterned gate dielectric layers 12a and 12b of silicon oxide of thickness from about 70 to about 150 angstroms formed upon the semiconductor substrate 10.

Similarly, within the preferred embodiment of the present invention with respect to the pair of floating gate electrodes 14a and 14b, although it is known in the art of semiconductor integrated circuit microelectronic fabrication, including in particular semiconductor integrated circuit microelectronic memory fabrication, that floating gate electrodes may be formed of conductor materials including but not limited to metal, metal alloy, doped polysilicon and polycide (doped polysilicon/metal silicide stack) conductor materials, for the preferred embodiment of the present invention, the pair of floating gate electrodes 14a and 14b is typically and preferably formed employing a doped polysilicon conductor material formed to a thickness which varies from about 500 to about 1500 angstroms in order to define a pair of concave interfaces (or surfaces) of the pair of floating gate electrodes 14a and 14b in conjunction with a pair of convex interfaces (or surfaces) of the pair of patterned silicon oxide hard mask layers 16a and 16b.

Finally, within the preferred embodiment of the present invention with respect to the pair of patterned silicon oxide hard mask layers 16a and 16b, the pair of patterned silicon oxide hard mask layers 16a and 16b is typically and preferably formed employing a thermal oxidation method wherein there is consumed portions a blanket doped polysilicon layer from which is formed the pair of floating gate electrodes 14a and 14b, when forming the pair of patterned silicon oxide hard mask layers 16a and 16b from the blanket doped polysilicon layer and subsequently forming the pair of floating gate electrodes 14a and 14b from blanket doped polysilicon layer.

Thus, and as is understood by a person skilled in the art, when forming the semiconductor integrated circuit microelectronic fabrication whose schematic cross-sectional diagram is illustrated in FIG. 1, there is first formed upon the semiconductor substrate 10 a blanket gate dielectric layer from which is formed the pair of patterned gate dielectric layers 12a and 12b. There is in turn formed upon the blanket gate dielectric layer the blanket doped polysilicon layer from which is formed both the pair of floating gate electrodes 14a and 14b and the pair of patterned silicon oxide hard mask layers 16a and 16b. To form the pair of patterned silicon oxide hard mask layers 16a and 16b, there is first formed upon the blanket doped polysilicon layer a patterned silicon nitride layer which serves as an oxidation mask for forming from a pair of portions of the blanket polysilicon layer exposed beneath the patterned silicon nitride layer the pair of patterned silicon oxide hard mask layers 16a and 16b. The pair of patterned silicon oxide hard mask layers 16a and 16b may then be employed as a pair of self aligned etch masks for forming from the blanket polysilicon layer and the blanket gate dielectric layer the corresponding pair of floating gate electrodes 14a and 14b, and the corresponding pair of patterned gate dielectric layers 12a and 12b.

Figure 2:
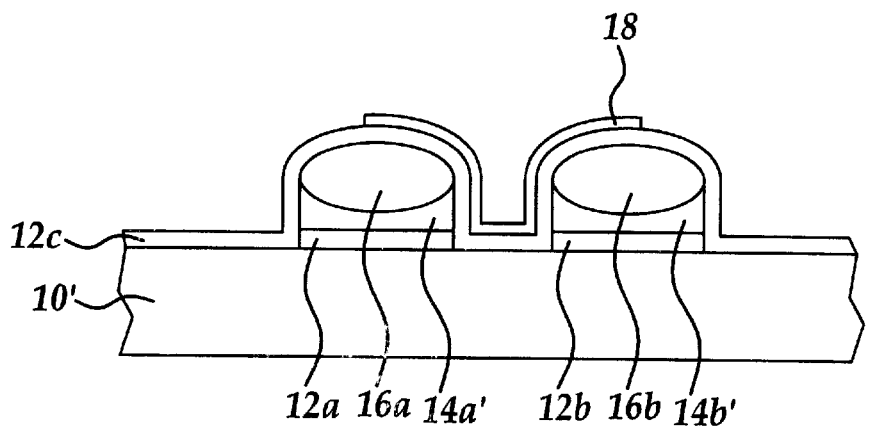

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein, in a first instance, there is formed upon the semiconductor integrated circuit microelectronic fabrication and completely encapsulating exposed portions of the pair of patterned gate dielectric layers 12a and 12b, the pair of floating gate electrodes 14a and 14b and the pair of patterned silicon oxide hard mask layers 16a and 16b, as illustrated within the schematic cross-sectional diagram of FIG. 1, a blanket inter-gate electrode dielectric layer 12c, which will also ultimately serve in part as an extension of the pair of gate dielectric layers 12a and 12b. The blanket inter-gate electrode dielectric layer 12c is typically and preferably formed employing a two step method which comprises: (1) an oxidizing thermal annealing of the semiconductor integrated circuit microelectronic fabrication whose schematic cross-sectional diagram is illustrated in FIG. 1 to provide a sidewall oxide growth upon the sidewalls of the pair of floating gates 14a and 14b as illustrated within the schematic diagram of FIG. 1 of from about 120 to about 250 angstroms while providing the pair of partially consumed floating gate electrodes 14a' and 14b' as illustrated within the schematic cross-sectional diagram of FIG. 2 and a gate oxide growth upon exposed surfaces of the semiconductor substrate 10 as illustrated within the schematic cross-sectional diagram of FIG. 1 of from about 120 to about 250 angstroms while providing a partially consumed semiconductor substrate 10' as illustrated within the schematic cross-sectional diagram of FIG. 2; followed by (2) a generally higher temperature deposition method which further deposits upon all exposed portions of the semiconductor integrated circuit microelectronic fabrication whose schematic cross-sectional diagram is illustrated in FIG. 1 an additional silicon oxide material formed to a thickness of from about 120 to about 250 angstroms. Thus, the blanket inter-gate electrode dielectric layer is at this point in the processing of the semiconductor integrated circuit microelectronic fabrication whose schematic cross-sectional diagram is illustrated in FIG. 2 formed to a thickness of from about 120 to about 250 angstroms.

There is also shown within the schematic cross-sectional diagram of FIG. 2 a single patterned silicon nitride barrier dielectric layer 18 formed upon the blanket inter-gate electrode dielectric layer 12c, but only contiguously covering a first portion of each of the pair of partially consumed floating gate electrodes 14a' and 14b', in conjunction with an adjacent portion of the semiconductor substrate 10 which is interposed between the pair of partially consumed floating gate electrodes 14a' and 14b'.

Within the preferred embodiment of the present invention, the patterned silicon nitride barrier dielectric layer 18 may be formed employing any of several methods as are conventional in the art of microelectronic fabrication, including but not limited to chemical vapor deposition (CVD) methods, plasma enhanced chemical vapor deposition (PECVD) methods and physical vapor deposition (PVD) sputtering methods, in conjunction with photolithographic methods and etch methods including but not limited to wet chemical etch methods and dry plasma etch methods. Typically and preferably, the patterned silicon nitride barrier dielectric layer 18 is formed to a thickness of from about 200 to about 800 angstroms while typically and preferably being formed employing a chemical vapor deposition (CVD) method. Typically and preferably, the patterned silicon nitride barrier dielectric layer 18 is formed covering only about one-half a linewidth dimension for each of the pair of partially consumed floating gate electrodes 14a' and 14b' as illustrated within the schematic cross-sectional diagram of FIG. 2.

While it is also feasible within the context of the present invention to form a patterned silicon nitride barrier dielectric layer, such as the patterned silicon nitride barrier dielectric layer 18, in an exchanged position beneath a blanket inter-gate dielectric layer, such as the blanket inter-gate dielectric layer 12c, and still realize at least in part the objects towards which the present invention is directed, such is generally not preferred within the present invention since such positioning of the patterned silicon nitride barrier dielectric layer may inhibit methods which may be employed for forming the blanket inter-gate dielectric layer.

Figure 3:
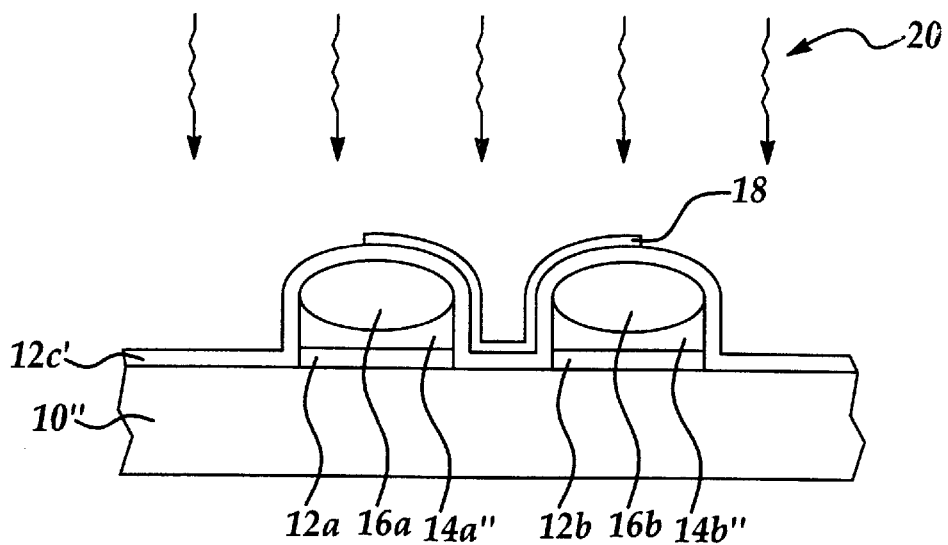

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross sectional diagram of a semiconductor integrated circuit microelectronic fabrication otherwise equivalent to the semiconductor integrated circuit microelectronic fabrication whose schematic cross-sectional diagram is illustrated in FIG. 2, but wherein the semiconductor integrated circuit microelectronic fabrication has been treated within an additional thermal annealing oxidizing atmosphere 20 to form in part from the blanket inter-gate electrode dielectric layer 12c a thermally annealed blanket inter-gate electrode dielectric layer 12c' which is generally thicker than the blanket inter-gate dielectric layer 12c by about 50 to about 80 angstroms, and thus has a thickness of from about 170 to about 330 angstroms. Similarly, there is also illustrated within the schematic cross-sectional diagram of FIG. 3 formed from the partially consumed semiconductor substrate 10' a further consumed semiconductor substrate 10" and also formed from the pair of partially consumed floating gate electrodes 14' and 14b' a pair of further consumed floating gate electrodes 14a" and 14b".

As is illustrated within the schematic cross-sectional diagram of FIG. 3, the pair of further consumed floating gate electrodes 14a" and 14b" is further consumed at their outboard edges that are nearer the further consumed semiconductor substrate 10" and not covered by the patterned silicon nitride barrier dielectric layer 18, but not at their inboard edges that are nearer the further consumed semiconductor substrate 10" and are covered by the patterned silicon nitride barrier dielectric layer 18.

Within the context of the present invention, the sharpness of the inboard edges of the pair of further consumed floating gate electrodes 14a" and 14b" is desirable insofar as the sharpness of the inboard edges of the pair of further consumed floating gate electrodes 14a" and 14b" provides for increased coupling of a source region which is subsequently formed within the further consumed semiconductor substrate 10" with each of the pair of further consumed floating gate electrodes 14a" and 14b", thus providing an enhanced programming speed within a pair of split gate field effect transistor (FET) devices derived from the semiconductor integrated circuit microelectronic fabrication whose schematic cross-sectional diagram is illustrated in FIG. 3.

Figure 4:
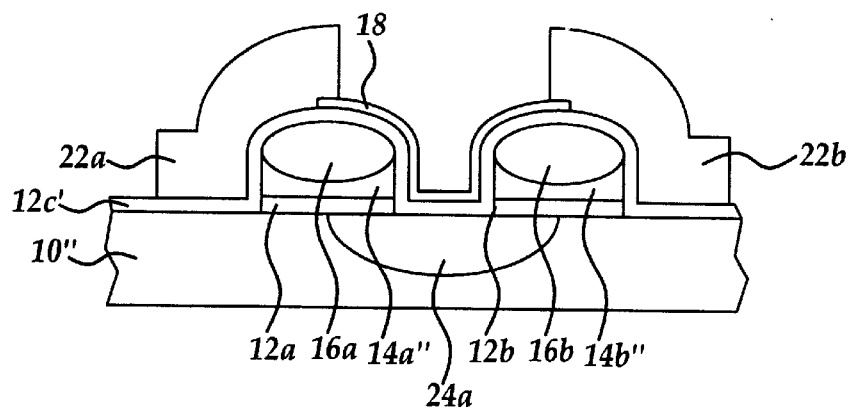

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, there has been formed covering a second portion of each of the pair of further consumed floating gate electrodes 14a" and 14b" not covered by the patterned silicon nitride dielectric layer 18 a pair of control gate electrodes 22a and 22b each of which further bridge over an additional portion of the thermally annealed blanket intergate electrode dielectric layer 12c' and the further consumed semiconductor substrate 10" which also does not have formed thereover the patterned silicon nitride barrier dielectric layer 18. As is understood by a person skilled in the art, the pair of control gate electrodes 22a and 22b is typically and preferably formed of a doped polysilicon conductor material formed to a thickness of from about 1500 to about 2500 angstroms over the second portions of the pair of further consumed floating gates 14a" and 14b" and the adjacent second portions of the further consumed semiconductor substrate 10" which do not have the patterned silicon nitride barrier dielectric layer 18 formed thereover.

Finally, there is also shown within the schematic cross-sectional diagram of FIG. 4 formed within the further consumed semiconductor substrate 10" and interposed between and extending beneath the pair of further consumed floating gate electrodes 14a" and 14b" a thermally diffused singly implanted source region 24. Within the preferred embodiment of the present invention, the thermally diffused singly implanted source region 24 is typically and preferably implanted at an ion implantation dose of from about 1E14 to about 1E15 dopant ions per square centimeter and an ion implantation energy of from about 10 to about 50 keV while employing a dopant of polarity opposite the further consumed semiconductor substrate 10", and subsequently thermally annealed at a temperature of from about 900 to about 1100 degrees centigrade to ensure adequate extension (typically and preferably from about 0.1 to about 0.3 microns) of the thermally diffused singly implanted source region 24 beneath the pair of further consumed floating gate electrodes 14a" and 14b".

Figure 5:
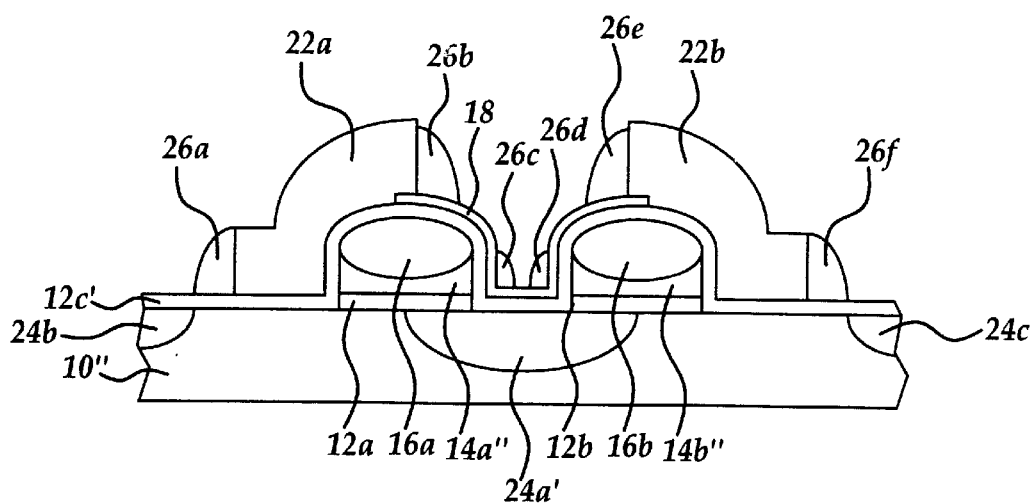

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein, in a first instance, there is formed adjoining both edges of the pair of control gate electrodes 22a and 22b a series of four dielectric spacer layers 26a, 26b, 26e and 26f, and wherein there is formed upon the patterned silicon nitride barrier dielectric layer 18 and interposed between the pair of further consumed floating gate electrodes 14a" and 14b" an additional pair of dielectric spacer layers 26c and 26d.

As is understood by a person skilled in the art, within the preferred embodiment of the present invention the foregoing series of six dielectric spacer layers 26a, 26b, 26c, 26d, 26e and 26f may be formed employing blanket dielectric layer deposition methods and anisotropic etch methods as are conventional in the art of microelectronic fabrication. Typically and preferably, the foregoing series of six dielectric spacer layers 26a, 26b, 26c, 26d, 26e, and 26f is formed of a dielectric spacer material selected from the group consisting of silicon oxide dielectric spacer materials, silicon nitride dielectric spacer materials and silicon oxynitride dielectric spacer materials, with silicon nitride dielectric spacer materials being particularly preferred.

Finally, there is also shown within the schematic cross-sectional diagram of FIG. 5, and formed within the further consumed semiconductor substrate 10", a thermally diffused doubly implanted source region 24a', along with a pair of singly implanted drain regions 24b and 24c.

As is understood by a person skilled in the art, the thermally diffused doubly implanted source region 24a' and the pair of singly implanted drain regions 24b and 24c may be formed in general employing ion implant methods generally analogous or equivalent to the ion implant methods as is employed for forming the thermally diffused singly implanted source region 24a, but wherein when further implanting the thermally diffused singly implanted source region 24a while simultaneously forming the thermally diffused doubly implanted source region 24a' and the singly implanted drain regions 24b and 24c there is typically and preferably employed a dopant (and/or thermal annealing conditions) such as to generally inhibit lateral diffusion of the pair of singly implanted drain regions 24b and 24c.

As is understood by a person skilled in the art, and particularly under circumstances where there might exist some photolithographically induced misalignment of the pair of control gate electrodes 22a and 22b with respect to the pair of further consumed floating gate electrodes 14a" and 14b", the presence within the present invention and the preferred embodiment of the present invention of the patterned silicon nitride barrier dielectric layer 18 provides for inhibited ion implant damage of the pair of further consumed floating gate electrodes 14a" and 14b" incident to the ion implant method which is employed for forming the thermally diffused singly implanted source region 24, the thermally diffused doubly implanted source region 24a', the singly implanted drain regions 24b and 24c, as well as during other ion implant methods which may be employed for further processing of the semiconductor integrated circuit microelectronic fabrication whose schematic cross-sectional diagram is illustrated within FIG. 5, wherein such other ion implant methods may include, but are not limited to, amorphizing ion implant methods which are employed when forming while employing thermal annealing methods metal silicide layers upon the control gate electrodes 22a and 22b. As is similarly also further understood by a person skilled in the art, inhibition of ion implanting into the pair of further consumed floating gate electrodes 14a" and 14b" (or their predecessor layers) is desirable when fabricating the pair of split gate field effect transistor (FET) devices whose schematic cross-sectional diagram is illustrated in FIG. 5 insofar as upon such ion implanting there is often provided compromised data retention properties within the pair of floating gate field effect transistor (FET) devices whose schematic cross-sectional diagram is illustrated in FIG. 5.

As is further understood by a person skilled in the art, the preferred embodiment of the present invention is illustrative of the present invention rather than limiting of the present invention. Revisions and modifications may be made to methods, materials, structures and dimensions through which is fabricated a split gate field effect transistor (FET) device in accord with the preferred embodiment of the present invention, while still providing a split gate field effect transistor (FET) device in accord with the present invention, further in accord with the accompanying claims.

What is claimed is:

1. A method for fabricating a split gate field effect transistor comprising:

providing a semiconductor substrate;

forming upon the semiconductor substrate a gate dielectric layer;

forming upon the gate dielectric layer a floating gate;

forming over the floating gate an inter-gate dielectric layer;

forming covering a first portion of the floating gate and a first portion of the semiconductor substrate adjacent the first portion of the floating gate a patterned silicon nitride barrier dielectric layer;

forming over the inter-gate dielectric layer and covering a second portion of the floating gate not covered by the patterned silicon nitride barrier dielectric layer and a second portion of the semiconductor substrate adjacent the second portion of the floating gate not covered by the patterned silicon nitride barrier layer a patterned control gate; and forming into the first portion of the semiconductor substrate and a third portion of the semiconductor substrate spaced from the first portion of the semiconductor substrate by the second portion of the semiconductor substrate a pair of source/drain regions.

2. The method of claim 1 wherein the patterned silicon nitride barrier dielectric layer inhibits oxidative loss of an edge of the floating gate when fabricating the split gate field effect transistor.

3. The method of claim 1 wherein the patterned silicon nitride barrier dielectric layer inhibits ion implant damage to the floating gate when fabricating the split gate field effect transistor.

4. The method of claim 1 wherein the gate dielectric layer is formed to a thickness of from about 70 to about 150 angstroms.

5. The method of claim 1 wherein the floating gate is formed to a thickness of from about 500 to about 1500 angstroms.

6. The method of claim 1 wherein the floating gate is formed with a concave upper surface.

7. The method of claim 1 wherein the patterned control gate is formed to a thickness of from about 1500 to about 2500 angstroms.

8. The method of claim 1 wherein the patterned silicon nitride barrier dielectric layer is formed beneath the inter-gate dielectric layer.

9. The method of claim 1 wherein the patterned silicon nitride barrier dielectric layer is formed above the inter-gate dielectric layer.

* * * * *